United States Patent
Long et al.

(10) Patent No.: US 9,357,671 B2
(45) Date of Patent: May 31, 2016

(54) COOLING UNIT AND METHOD

(75) Inventors: Rong Long, Shanghai (CN); Jinghua Yu, Shanghai (CN); Ting Zhou, Shanghai (CN)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 279 days.

(21) Appl. No.: 13/978,611

(22) PCT Filed: Jan. 11, 2011

(86) PCT No.: PCT/CN2011/070172
§ 371 (c)(1),
(2), (4) Date: Sep. 4, 2013

(87) PCT Pub. No.: WO2012/094806
PCT Pub. Date: Jul. 19, 2012

(65) Prior Publication Data
US 2013/0333401 A1    Dec. 19, 2013

(51) Int. Cl.
*F25B 39/02* (2006.01)
*H05K 7/20* (2006.01)
*F24F 1/00* (2011.01)

(52) U.S. Cl.
CPC .......... *H05K 7/20136* (2013.01); *F24F 1/0059* (2013.01); *H05K 7/20745* (2013.01); *H05K 7/20818* (2013.01)

(58) Field of Classification Search
CPC .. F24F 1/0059; F24F 1/0033; H05K 7/20136; H05K 7/20745; H05K 7/20309; H05K 7/20718; H05K 7/20818
See application file for complete search history.

(56) References Cited

U.S. PATENT DOCUMENTS

| | | | |
|---|---|---|---|
| 1,680,092 A | 8/1928 | Dixson | |
| 2,060,582 A | 11/1936 | Leffert | |
| 3,545,224 A | 12/1970 | Nicoski et al. | |
| 3,791,089 A | 2/1974 | Alderman | |
| 4,063,431 A | 12/1977 | Dankowski | |
| 4,083,245 A | 4/1978 | Osborn | |

(Continued)

FOREIGN PATENT DOCUMENTS

| CN | 1521591 A | 8/2004 |
|---|---|---|
| CN | 101070979 A | 11/2007 |

(Continued)

OTHER PUBLICATIONS

Extend European Search Report from corresponding Application No. 11855502.8 dated Jun. 2, 2014.

(Continued)

*Primary Examiner* — Jonathan Bradford
*Assistant Examiner* — Elizabeth Martin
(74) *Attorney, Agent, or Firm* — Lando & Anastasi, LLP

(57) ABSTRACT

A cooling unit (10) includes a housing (12) having a front (14) and a back (16), one or more fans (28) provided at either the front (14) or the back (16) of the housing (12), and a V-shaped evaporator (30) positioned within the housing (12) and coupled to a source of liquid refrigerant. The V-shaped evaporator (30) has two panels extending from adjacent to the bottom (22) of the housing to adjacent to the top (24) of the housing (12) when positioning the evaporator (30) in the housing (12). The arrangement is such that an inside of the panels of the evaporator (30) faces air being drawn through the housing (12) of the cooling unit (10) by the fan (28).

8 Claims, 6 Drawing Sheets

(56) References Cited

U.S. PATENT DOCUMENTS

| | | |
|---|---|---|
| 4,138,857 A | 2/1979 | Dankowski |
| 5,028,087 A | 7/1991 | Ells |
| 5,259,206 A | 11/1993 | Dankowski |
| 5,279,360 A | 1/1994 | Hughes et al. |
| 5,341,870 A | 8/1994 | Hughes et al. |
| 5,533,259 A | 7/1996 | Hughes et al. |
| 5,879,232 A | 3/1999 | Luter, II et al. |
| 5,924,300 A | 7/1999 | Fromm et al. |
| 6,034,873 A | 3/2000 | Ståhl et al. |
| 6,189,607 B1 | 2/2001 | Hosoya et al. |
| 6,199,337 B1 | 3/2001 | Colson et al. |
| 6,315,525 B1 | 11/2001 | Webb |
| 6,343,011 B1 | 1/2002 | Yu |
| 6,668,565 B1 | 12/2003 | Johnson et al. |
| 6,672,955 B2 | 1/2004 | Charron |
| 6,732,789 B2 | 5/2004 | Jang |
| 6,859,366 B2 | 2/2005 | Fink |
| 6,880,349 B2 | 4/2005 | Johnson et al. |
| 6,967,283 B2 | 11/2005 | Rasmussen et al. |
| 6,980,433 B2 | 12/2005 | Fink |
| 7,046,514 B2 | 5/2006 | Fink et al. |
| 7,140,193 B2 | 11/2006 | Johnson et al. |
| 7,145,772 B2 | 12/2006 | Fink |
| 7,165,412 B1 | 1/2007 | Bean, Jr. |
| 7,173,820 B2 | 2/2007 | Fink et al. |
| 7,259,963 B2 | 8/2007 | Germagian et al. |
| 7,278,273 B1 | 10/2007 | Whitted et al. |
| 7,293,666 B2 | 11/2007 | Mattlin et al. |
| 7,297,022 B2 | 11/2007 | Pearce |
| 7,325,410 B1 | 2/2008 | Bean, Jr. |
| 7,372,695 B2 | 5/2008 | Coglitore et al. |
| 7,372,698 B1 | 5/2008 | Tilton et al. |
| 7,403,391 B2 | 7/2008 | Germagian et al. |
| 7,430,118 B1 | 9/2008 | Noteboom et al. |
| 7,508,663 B2 | 3/2009 | Coglitore |
| 7,508,666 B1 | 3/2009 | Henneberg et al. |
| 7,511,960 B2 | 3/2009 | Hillis et al. |
| 7,551,971 B2 | 6/2009 | Hillis |
| 7,611,327 B2 | 11/2009 | Holston et al. |
| 7,643,285 B2 | 1/2010 | Nishiyama et al. |
| 7,646,590 B1 | 1/2010 | Corhodzic et al. |
| 7,688,578 B2 | 3/2010 | Mann et al. |
| 7,724,518 B1 | 5/2010 | Carlson et al. |
| 7,800,900 B1 | 9/2010 | Noteboom et al. |
| 7,856,838 B2 | 12/2010 | Hillis et al. |
| 7,916,470 B2 | 3/2011 | Mills et al. |
| 7,944,692 B2 | 5/2011 | Grantham et al. |
| 7,957,142 B2 | 6/2011 | Noteboom et al. |
| 7,990,710 B2 | 8/2011 | Hellriegel et al. |
| 8,031,468 B2 | 10/2011 | Bean, Jr. et al. |
| 8,174,829 B1 * | 5/2012 | Rotheroe .................. 361/696 |
| 8,184,435 B2 | 5/2012 | Bean, Jr. et al. |
| 8,251,785 B2 | 8/2012 | Schmitt et al. |
| 8,305,757 B2 | 11/2012 | Keisling et al. |
| 8,360,833 B2 | 1/2013 | Grantham |
| 8,405,982 B2 | 3/2013 | Grantham et al. |
| 8,611,087 B2 | 12/2013 | Sato et al. |
| 8,628,154 B2 | 1/2014 | Caveney et al. |
| 8,628,158 B2 | 1/2014 | Caveney |
| 2003/0050003 A1 | 3/2003 | Charron |
| 2004/0184232 A1 | 9/2004 | Fink |
| 2005/0011637 A1 | 1/2005 | Takano |
| 2005/0209740 A1 | 9/2005 | Vann |
| 2005/0280986 A1 | 12/2005 | Coglitore et al. |
| 2006/0108105 A1 | 5/2006 | Huang et al. |
| 2006/0260338 A1 | 11/2006 | VanGilder et al. |
| 2006/0283111 A1 | 12/2006 | Ayers et al. |
| 2007/0084589 A1 | 4/2007 | Nishino et al. |
| 2007/0146994 A1 | 6/2007 | Germagian et al. |
| 2007/0163748 A1 | 7/2007 | Rasmussen et al. |
| 2007/0165377 A1 | 7/2007 | Rasmussen et al. |
| 2007/0167125 A1 | 7/2007 | Rasmussen et al. |
| 2007/0262606 A1 | 11/2007 | Schnoblen et al. |
| 2008/0041076 A1 | 2/2008 | Tutunoglu et al. |
| 2008/0041077 A1 | 2/2008 | Tutunoglu |
| 2008/0043426 A1 | 2/2008 | Nishiyama et al. |
| 2008/0055850 A1 | 3/2008 | Carlson et al. |
| 2008/0060372 A1 | 3/2008 | Hillis et al. |
| 2008/0123288 A1 | 5/2008 | Hillis |
| 2008/0141525 A1 | 6/2008 | Breiding et al. |
| 2008/0160902 A1 | 7/2008 | Desler |
| 2008/0173434 A1 * | 7/2008 | Matter et al. .................. 165/150 |
| 2008/0185446 A1 | 8/2008 | Tozer |
| 2008/0198549 A1 | 8/2008 | Rasmussen et al. |
| 2008/0245083 A1 | 10/2008 | Tutunoglu et al. |
| 2008/0291626 A1 | 11/2008 | Nelson et al. |
| 2009/0014397 A1 | 1/2009 | Moss et al. |
| 2009/0025418 A1 * | 1/2009 | De La Cruz ............ F25B 40/00 62/515 |
| 2009/0046427 A1 | 2/2009 | Noteboom et al. |
| 2009/0046429 A1 | 2/2009 | Werner et al. |
| 2009/0080173 A1 | 3/2009 | Porter et al. |
| 2009/0086428 A1 | 4/2009 | Campbell et al. |
| 2009/0100848 A1 * | 4/2009 | Kuriyama .......... H05K 7/20745 62/132 |
| 2009/0129913 A1 | 5/2009 | Schutte et al. |
| 2009/0168345 A1 | 7/2009 | Martini |
| 2009/0241578 A1 | 10/2009 | Carlson et al. |
| 2009/0251860 A1 | 10/2009 | Belady et al. |
| 2009/0255653 A1 | 10/2009 | Mills et al. |
| 2009/0259343 A1 | 10/2009 | Rasmussen et al. |
| 2009/0319650 A1 | 12/2009 | Collins et al. |
| 2010/0061057 A1 | 3/2010 | Dersch et al. |
| 2010/0111698 A1 | 5/2010 | Wiedeman et al. |
| 2010/0144265 A1 | 6/2010 | Bednarcik et al. |
| 2010/0188816 A1 | 7/2010 | Bean, Jr. et al. |
| 2010/0190430 A1 | 7/2010 | Rodriguez et al. |
| 2010/0230058 A1 | 9/2010 | Mahoney |
| 2010/0263830 A1 | 10/2010 | Noteboom et al. |
| 2010/0300648 A1 | 12/2010 | Grantham |
| 2010/0307716 A1 | 12/2010 | Bean, Jr. et al. |
| 2010/0315775 A1 | 12/2010 | Grantham et al. |
| 2010/0329885 A1 | 12/2010 | Criner et al. |
| 2011/0108207 A1 | 5/2011 | Mainers et al. |
| 2011/0299242 A1 | 12/2011 | Grantham et al. |
| 2012/0012283 A1 | 1/2012 | Bean, Jr. et al. |
| 2012/0300391 A1 | 11/2012 | Keisling et al. |
| 2013/0139530 A1 | 6/2013 | Tutunoglu et al. |
| 2013/0300266 A1 | 11/2013 | Ramey et al. |

FOREIGN PATENT DOCUMENTS

| | | |
|---|---|---|
| CN | 200972216 Y | 11/2007 |
| CN | 101438637 A | 5/2009 |
| DE | 200414274 U1 | 11/2000 |
| DE | 20 2004 003309 U1 | 8/2004 |
| DE | 202008010718 U1 | 2/2009 |
| EP | 0033182 A2 | 8/1981 |
| EP | 1 069 381 A1 | 1/2001 |
| EP | 1448040 A2 | 8/2004 |
| FR | 2949641 A1 | 3/2011 |
| JP | 2003-166729 A | 6/2003 |
| JP | 2005260148 A | 9/2005 |
| JP | 2006071253 A | 3/2006 |
| JP | 2007316989 A | 12/2007 |
| JP | 2009097774 A | 5/2009 |
| JP | 2010122747 A | 6/2010 |
| JP | 2010 271942 A | 12/2010 |
| SE | 456449 B | 10/1988 |
| WO | 9963797 A1 | 12/1999 |
| WO | 2007090804 A2 | 8/2007 |

OTHER PUBLICATIONS

"Inter-Rack Flow Seperator to Prevent Computer Rack Hot Exhaust Air Entry into Cold Region at Rack Inlet of Computer Data Center Facilities" ip.com Journal, ip.com Inc., West Henrietta, NY, US, Jun. 20, 2006, XP013114636 ISSN: 1533-0001.

American Power Conversion Corporation Brochure, "Hot Aisle Containment System (HACS)," 2008, pp. 1-68.

(56) References Cited

OTHER PUBLICATIONS

APC's InfraStruXure(R) Hot-Aisle Containment Systems a Key to Sun's New Energy Efficient Data Center, Press release of American Power Conversion Corporation, West Kingston, R.I., Oct. 16, 2007.

Rotheroe et al., "Hot Aisle Based Heat Removal Unit", RD545030, Hewlett-Packard Co., Sep. 2009.
Stahl et al., "Designing an Alternative to Conventional Room Cooling", Interlec 2001, Oct. 2001, pp. 109-115.

* cited by examiner

COOLING UNIT AND METHOD

This application is a National Stage Application under 35 U.S.C. §371 from PCT/CN2011/070172, filed Jan. 11, 2011, which is hereby incorporated by reference in its entirety for all purposes.

BACKGROUND OF THE INVENTION

1. Field of Disclosure

Aspects of the present disclosure relate generally to data centers containing racks and enclosures used to house data processing, networking and telecommunications equipment, and more particularly to cooling systems and methods used to cool equipment housed by such racks and enclosures.

2. Discussion of Related Art

Equipment enclosures or racks for housing electronic equipment, such as data processing, networking and telecommunications equipment have been used for many years. Such racks are used to contain and to arrange the equipment in small wiring closets as well as equipment rooms and large data centers. In certain embodiments, an equipment rack can be an open configuration and can be housed within a rack enclosure, although the enclosure may be included when referring to a rack.

Over the years, a number of different standards have been developed to enable equipment manufacturers to design rack mountable equipment that can be mounted in standard racks manufactured by different manufacturers. A standard rack typically includes front mounting rails to which multiple units of electronic equipment, such as servers, CPUs and telecommunication equipment, are mounted and stacked vertically within the rack. An exemplary industry standard rack is approximately six to six-and-a-half feet high, by about twenty-four inches wide, and about forty inches deep. Such a rack is commonly referred to as a "nineteen inch" rack, as defined by the Electronics Industries Association's EIA-310-D standard. Nineteen inch racks are used extensively in data centers and other large facilities. With the proliferation of the Internet, it is not uncommon for a data center to contain hundreds of these racks. Further, with the ever decreasing size of computer equipment, and in particular, computer servers and blades, the number of electrical devices mounted in each rack has been increasing, raising concerns about adequately cooling the equipment.

Heat produced by rack-mounted equipment can have adverse effects on the performance, reliability and useful life of the equipment components. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

Previously, in certain configurations, data centers have been cooled by computer room air conditioner ("CRAC") units that are positioned around the periphery of the data center room. These CRAC units intake air from the fronts of the units and output cooler air upwardly toward the ceiling of the data center room. In other embodiments, the CRAC units intake air from near the ceiling of the data center room and discharge cooler air under a raised floor for delivery to the fronts of the equipment racks. In general, such CRAC units intake room temperature air (at about 72° F.) and discharge cold air (at about 55° F.), which is blown into the data center room and mixed with the room temperature air at or near the equipment racks. The rack-mounted equipment typically cools itself by drawing air along a front side or air inlet side of a rack, drawing the air through its components, and subsequently exhausting the air from a rear or vent side of the rack.

For examples of cooling units that may be configured to be placed within a data center, reference may be made to: U.S. patent application Ser. No. 11/335,874, entitled COOLING SYSTEM AND METHOD, by Neil Rasmussen, John Bean, Greg Uhrhan and Scott Buell, filed on Jan. 19, 2006; U.S. Pat. No. 7,365,973, entitled COOLING SYSTEM AND METHOD, by Neil Rasmussen, John H. Bean, Greg R. Uhrhan and Scott D. Buell, issued on Apr. 29, 2008; and U.S. patent application Ser. No. 11/335,901, entitled COOLING SYSTEM AND METHOD, by Neil Rasmussen, John Bean, Vincent Long, Greg Uhrhan and Matthew Brown, filed on Jan. 19, 2006, all of which are incorporated herein by reference in their entirety for all purposes. Other examples of cooling units may be found in U.S. patent application Ser. No. 11/504,382, entitled METHOD AND APPARATUS FOR COOLING, by Ozan Tutunoglu, filed on Aug. 15, 2006, abandoned, and U.S. patent application Ser. No. 11/504,370, entitled METHOD AND APPARATUS FOR COOLING, by Ozan Tutunoglu and David Lingrey, filed on Aug. 15, 2006, 2006, both of which are incorporated herein by reference in their entirety for all purposes.

BRIEF SUMMARY OF THE INVENTION

In one aspect of the disclosure a cooling unit comprises a housing having a front and a back, one or more fans provided at either the front or the back of the housing, and a V-shaped evaporator positioned within the housing and coupled to a source of liquid refrigerant. In a certain embodiment, the V-shaped evaporator has two panels extending from adjacent the bottom of the housing to adjacent the top of the housing when positioning the evaporator in the housing. The arrangement is such that an inside of the panels of the evaporator face air being drawn through the housing of the cooling unit by the fan.

Embodiments of the cooling unit include providing each panel of the V-shaped evaporator with at least one cooling slab in fluid communication with the source of liquid refrigerant. The cooling slab includes an inlet for receiving liquid refrigerant from the source of liquid refrigerant and an outlet to exhaust vaporized refrigerant to the source of liquid refrigerant. The cooling slab further includes an inlet header having the inlet, an outlet header having the outlet, and a transfer header disposed between the inlet header and the outlet header. In one embodiment, the cooling slab further includes micro channel coils disposed between the inlet header and the transfer header and micro channel coils disposed between the transfer header and the outlet header. In one embodiment, the V-shaped evaporator includes at least two, e.g., three cooling slabs in fluid communication with the source of liquid refrigerant. Each cooling slab includes the inlet for receiving liquid refrigerant from the source of liquid refrigerant and the outlet to exhaust vaporized refrigerant to the source of liquid refrigerant. In a particular embodiment, the housing of the cooling unit is one-half the width of a standard size nineteen inch equipment rack.

Another aspect of the disclosure is directed to a method of cooling warm air. In one embodiment, the method comprises: positioning a cooling unit in a data center; drawing relatively warm air into the cooling unit; and moving the warm air over a V-shaped evaporator positioned within a housing of the cooling unit and coupled to a source of liquid refrigerant.

Embodiments of the method include providing the evaporator with two panels that extend from adjacent the bottom of the housing to adjacent the top of the housing. The arrangement is such that an inside of the panels of the evaporator face air being drawn through the housing of the cooling unit by the at least one fan. Each panel of the V-shaped evaporator includes at least two cooling slabs in fluid communication with the source of liquid refrigerant. Each cooling slab includes an inlet for receiving liquid refrigerant from the source of liquid refrigerant, an outlet to exhaust vaporized refrigerant to the source of liquid refrigerant, an inlet header having the inlet, and an outlet header having the outlet. Each cooling slab further includes micro channel coils disposed between the inlet header and the outlet header.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE INVENTION

Figure 1:
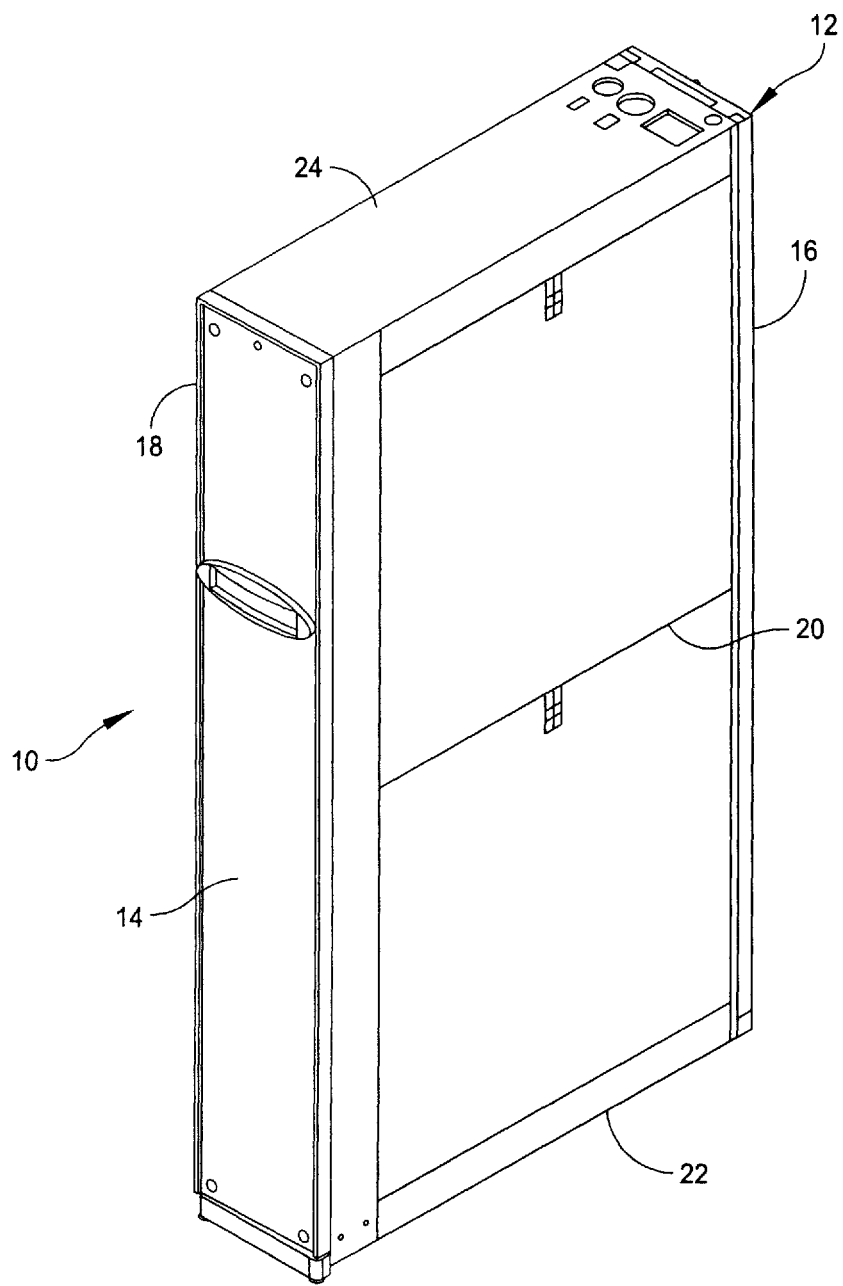
FIG. 1 is a perspective view of a cooling unit of an embodiment of the present disclosure.

This disclosure is not limited in its application to the details of construction and the arrangement of components set forth in the following description or illustrated in the drawings. The principles set forth in this disclosure are capable of being provided in other embodiments and of being practiced or of being carried out in various ways. Also, the phraseology and terminology used herein is for the purpose of description and should not be regarded as limiting. The use of "including," "comprising," "having," "containing", "involving", and variations thereof herein, is meant to encompass the items listed thereafter and equivalents thereof as well as additional items.

At least one embodiment of the present disclosure is directed to a modular cooling unit that is selectively positionable to cool electronic equipment housed within equipment enclosures or racks of a data center. As used herein, "enclosures" and "racks" are used to describe apparatus designed to support electronic equipment. Such a cooling system is capable of employing one or more cooling units on an as needed basis to provide localized cooling within the data center. Specifically, multiple cooling units may be interspersed in a row of equipment racks to more efficiently cool the data center. The circulation path of warm air generated by the electronic equipment is greatly reduced, thereby nearly eliminating the mixing of hot and cold air within the data center.

Data centers are typically large rooms designed, in certain instances, to house hundreds of electronic equipment racks arranged in rows within the data center. The rows of equipment racks are arranged in such a manner that there are cold aisles and hot aisles. The cold aisles provide access to the fronts of the enclosures where the electronic equipment is typically accessed. The hot aisles provide access to the backs of the equipment racks. As requirements change, the number of equipment racks may be increased or decreased depending on the functional requirements of the data center. At least one embodiment of the cooling unit of the present disclosure is modular and scalable. Also, although relatively large data centers are discussed as an intended use for such a cooling system incorporating cooling units, as mentioned above, the cooling units of the present disclosure may be employed in smaller rooms on a smaller scale.

In one embodiment, each cooling unit has a housing that is configured to support components of the cooling system within the housing. For example, the components of the cooling unit may include a V-shaped heat exchanger embodying a micro channel evaporator that is coupled to a source of liquid refrigerant. The V-shaped evaporator is connected to the source so that liquid refrigerant is delivered to the evaporator and vaporized refrigerant is returned to the source. The cooling unit may further include one or more fans at the front or the rear of the cooling unit to move air across the heat exchanger. As discussed above, the cooling unit may be disposed within a row of equipment racks and configured to intake the hot air within the data center from a hot aisle, for example, to cool the air to slightly below ambient temperature. This configuration eliminates the inefficiency of mixing hot air with the room temperature air to obtain a warm mixture.

In certain embodiments, the cooling unit may be one-half the width of a standard size nineteen inch equipment rack, e.g., twelve inches in width, and may be modular so that the cooling unit may be inserted into a row of equipment racks in a matter of minutes by data center employees who have no particular heating and cooling training or specialization. The modular nature of the cooling system allows the user to optimize the location of each cooling unit. Thus, the cooling system may be employed and redeployed for maximum efficiency and use within the data center.

Figure 2:
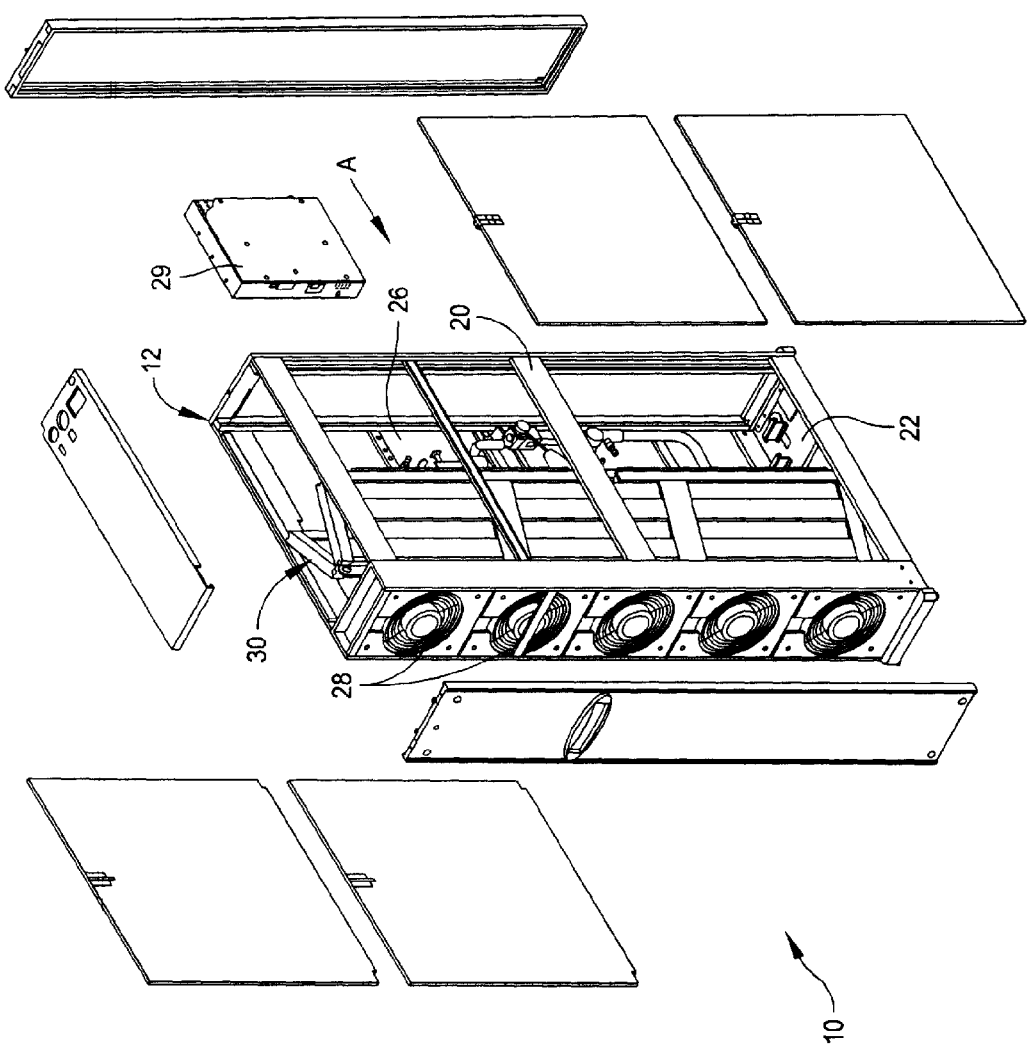
FIG. 2 is an exploded perspective view of the cooling unit illustrating panels and a controller of the cooling unit separated from the remainder of the cooling unit.
Figure 3:
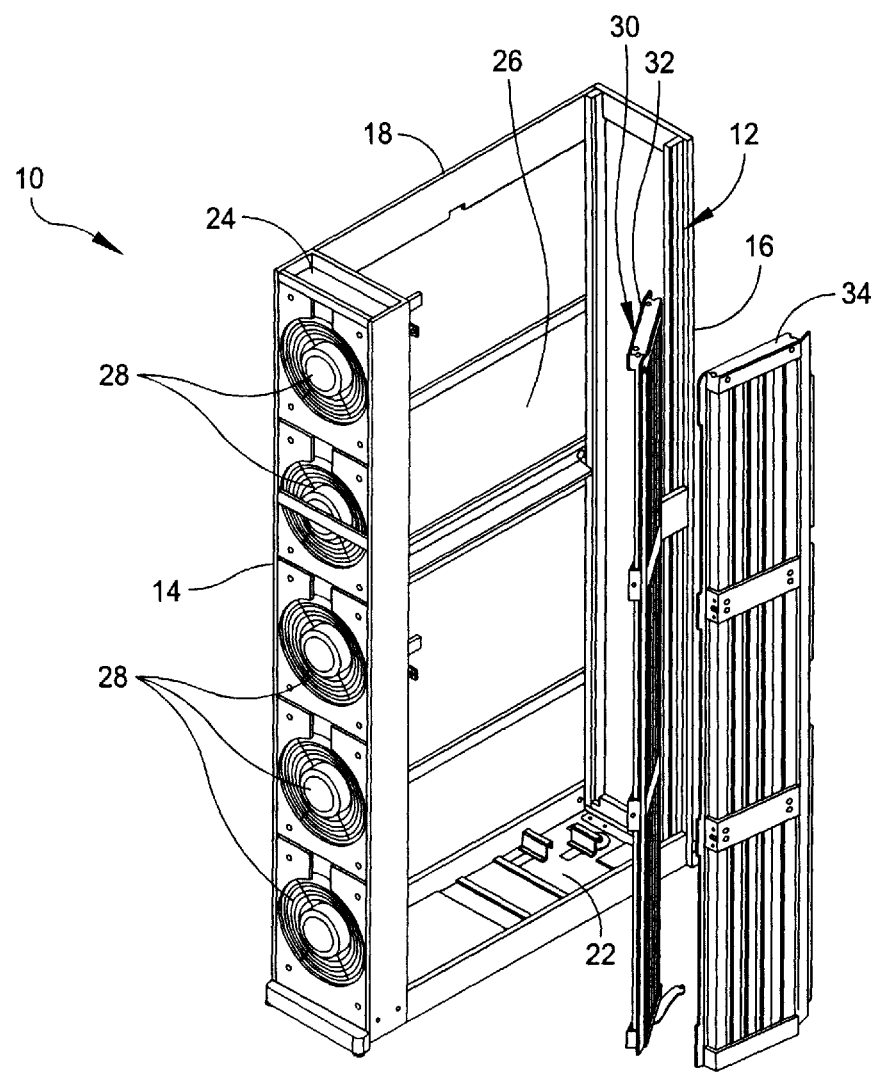
FIG. 3 is a perspective view of the cooling unit illustrating a V-shaped evaporator removed from the cooling unit.

Turning now to the drawings, in order to address the heat build-up and hot spots within the data center, and to address climate control issues within the data center in general, a modular cooling unit, generally indicated at 10, is provided in one embodiment. As shown in FIGS. 1 and 2, the cooling unit 10 includes a housing 12 that may be constructed similarly to a housing of an equipment rack. Like an equipment rack, the housing 12 of the cooling unit 10 is a rectangular structure having a front 14, a back 16, two sides 18, 20, a bottom 22 and a top 24 defined by a frame constructed of vertical and horizontal support members. Covers or panels (not designated) are provided to cover the front 14, back 16, sides 18, 20 and top 24. These covers are removed from the housing in FIG. 2 so that the internal components of the cooling unit 10 are viewed. As will be disclosed in greater detail below, the cooling unit 10 is configured to accommodate and house cooling equipment, and, in some embodiments, may be conveniently broken down and disassembled for transport or storage with the aid of hand tools only.

As shown in FIG. 1, in one embodiment, the housing 12 of the cooling unit 10 has a width that is approximately one-half the width of the equipment rack. As stated above, a standard nineteen inch rack has a width of approximately twenty-four inches. Thus, the width of the housing 12 of the cooling unit 10 is approximately twelve inches. This sizing enables the person configuring the data center to position a cooling unit or multiple cooling units in between equipment racks while being able to maintain equivalent spacing among several rows. The narrower width of the cooling unit 10 also takes up less space, and, coupled with the modular and movable nature of the cooling unit, enables the cooling unit to be conveniently placed between two equipment racks in an easily scalable manner.

As discussed above, the cooling unit 10 may include one or more side panels attachable to the frame of the housing 12 to cover the sides 18, 20 of the cooling unit. Similarly, the housing 12 may further include a front panel to cover portions of the front 14 of the cooling unit 10. The back 16 of the housing 12 of the cooling unit 10 may include a back panel suitably secured to the frame constituting the housing. The back panel enables an operator of the data center to access an interior region of the cooling unit 10. A top panel may further be provided to cover the top 24 of the cooling unit 10. In one embodiment, the front, side and back panels may be suitably secured, e.g., by suitable screw fasteners, to the frame of the cooling unit. In another embodiment, fasteners capable of manipulation by hand, e.g., thumb screws or quarter-turn fasteners, may be employed to attach the panels to the frame. The housing 12 of the cooling unit 10 creates a space within an interior region 26 of the cooling unit to allow components of a cooling system to be housed within the cooling unit. In certain embodiments, the front panel and the back panel may be secured to the frame of the housing of the cooling unit by quarter-turn latches to enable easy attachment and removal of the panels so that the interior region 26 may be quickly accessed. The components and configuration of such a cooling system shall be described in greater detail as the description of the cooling system proceeds.

The cooling unit 10 is modular in construction and configured to be rolled into and out of position, e.g., within a row of the data center between two equipment racks. Casters (not shown) may be secured to the front frame and the rear frame of the housing 12 of the cooling unit 10 to enable the cooling unit to roll along the floor of the data center. Once positioned, leveling feet (not shown) may be deployed to securely ground the cooling unit 10 in place within the row. In another embodiment, the housing 12 of the cooling unit 10 may be formed with an eye-bolt to enable a crane or some other lifting apparatus to raise and place the cooling unit within the data center.

In one embodiment, the arrangement is such that the front 14 of the cooling unit 10 and the front of the equipment rack are adjacent the cold aisle of the data center and the back 16 of the cooling unit and the back of the equipment rack are adjacent the hot aisle. The modular and movable nature of the cooling unit 10 makes it particularly effective in cooling locations within the data center requiring climate control, e.g., adjacent a hot aisle. This configuration enables the cooling unit 10 to be used as a building block for data center cooling and climate control, as the data center operator adds and removes cooling units on an as needed basis. Thus, the cooling unit 10 allows a far superior level of scalability than prior cooling systems and methods. In addition, an operable cooling unit may be quickly and easily provided to replace a failed cooling unit.

As shown in FIGS. 1 and 2, the front 14 of the housing generally indicated at 12 of the cooling unit 10 has a number of variable speed fans (e.g., five), each indicated at 28, that are adapted to draw air from the back 16 of the cooling unit to the front of the cooling unit as shown by arrow A. In some embodiments, the air may be passed through one or more filters (not shown) disposed within the interior region 26 of the cooling unit 10 to purify the air. In one embodiment, the fans 28 may be assembled and wired within the housing 12 of the cooling unit 10 such that a fan is removed by removing screws and sliding the fan out of a receptacle (not shown) formed in the housing of the cooling unit. The electrical power provided to each fan 28 may be connected and disconnected by a suitable connector, such as a blindmate connector. The arrangement is such that the fans 28 are "hot swappable" based on voltage requirements as well as their easy removal from the receptacle and blindmate connector. In some embodiments, a controller 29 may be configured to monitor the operation of each fan 28 so as to predict the failure of a fan based on power draw variances of the fan. The controller 29 is also configured to control the operation of the other working components of the cooling unit 10. Although the fans 28 are shown to be located at the front 14 of the cooling unit 10 illustrated in FIG. 1, the fans may alternatively be provided at the back 16 of the cooling unit to blow air into the interior region 26 of the cooling unit.

Referring now to FIGS. 1-5, further provided within the housing 12 of the cooling unit 10 is a heat exchanger. In one embodiment, the heat exchanger embodies a V-shaped evaporator, generally indicated at 30, having two panels 32, 34 that are connected together along long edges of the panels. As shown in FIG. 2, the V-shaped evaporator 30 is positioned within the interior region 26 of the housing 12 of the cooling unit 10 such that an inside portion or surface 36 of the evaporator faces the air being drawn through the cooling unit from the back 16 of the cooling unit to the front 14 of the cooling unit as represented by arrows A. An outside portion or surface 38 of the V-shaped evaporator 30 faces the fans 28 provided at the front 14 of the cooling unit 10.

Each panel 32, 34 of the V-shaped evaporator 30 is positioned at an angle with respect to airflow through the cooling unit 10 to maximize the surface area of airflow contacting the evaporator. The arrangement is such that the hot air that is drawn through the back 16 of the cooling unit 10 and passed through the V-shaped evaporator 30 to reduce the temperature of the hot air. As mentioned above, the cooling unit 10 may be positioned so that the back 16 of the cooling unit is adjacent a hot aisle. Thus, the air drawn through the back 16 of the cooling unit 10 is relatively hotter than ambient air within the data center. The fans 28, after drawing the relatively warm air through the V-shaped evaporator 30, blow the relatively cool air from the evaporator through the front 14 of the cooling unit. In one embodiment, the cooling unit 10 may provide up to 30 kW of cooling.

Figure 4:
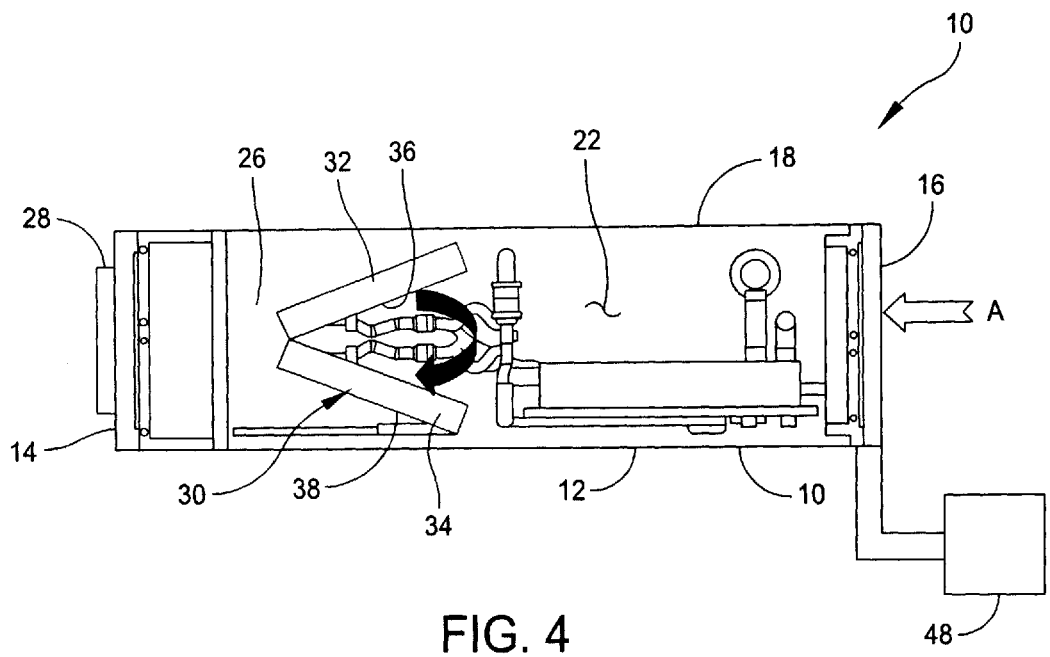
FIG. 4 is a top plan view of the cooling unit.
Figure 5:
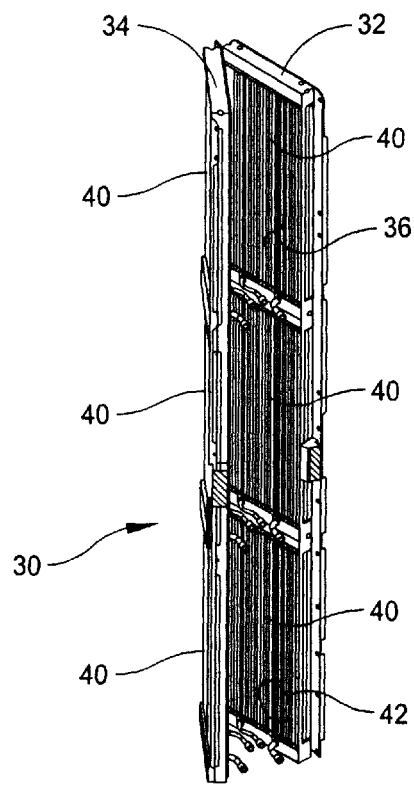
FIG. 5 is a perspective view of the V-shaped evaporator.
Figure 6:
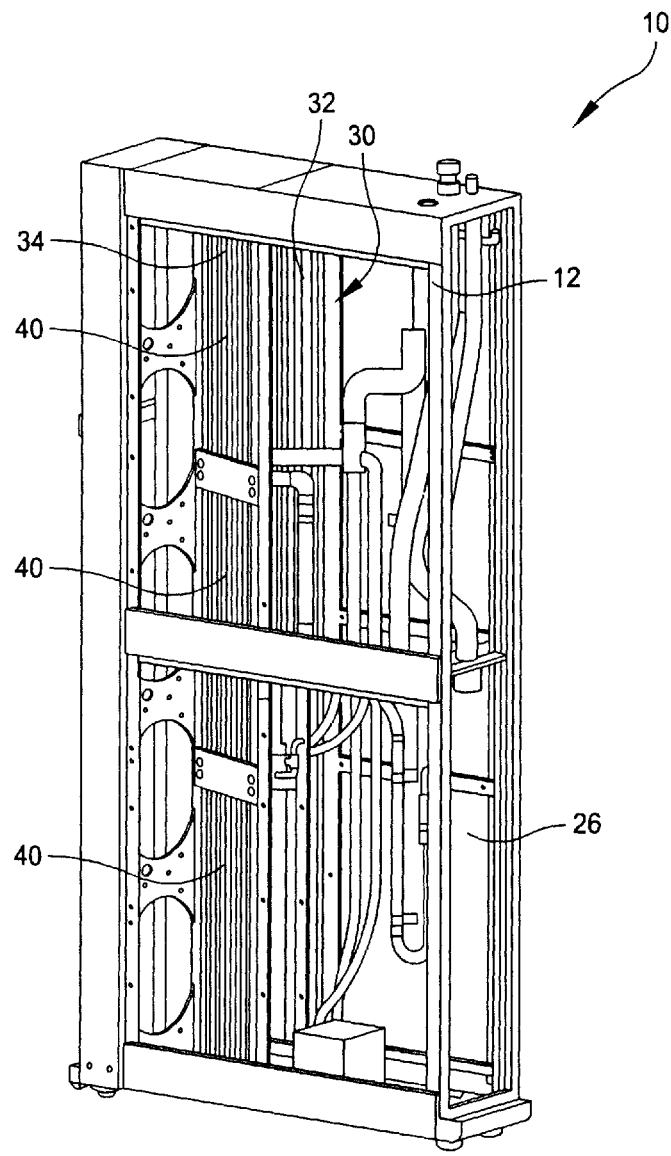
FIG. 6 is another perspective view of the cooling unit having selected components removed, particularly fans of the cooling unit removed.

Turning to FIGS. 4 and 6, each panel 32, 34 of the V-shaped evaporator 30 has three slabs, each indicated at 40, which are arranged one on top of the other so that they extend vertically within the interior region 26 of the cooling unit 10. Each slab 40 of the V-shaped evaporator 30 includes a plurality of cooling coils 42, each coil having fins. The cooling coils 42 provided in each slab 40 include an inlet 44 to enable liquid refrigerant to enter the cooling coil 42 and an outlet 46 to exhaust vapor refrigerant from the cooling coil. The manner in which refrigerant enters and exits each slab 40 of the V-shaped evaporator 30 will be described below with reference to FIGS. 5 and 7.

The arrangement is such that liquid refrigerant is provided to the inlet 44 of each slab 40 of the V-shaped evaporator 30 by a line (not designated), and vaporized refrigerant is exhausted from the outlet 46 of each slab of the V-shaped evaporator by another line (not designated). In certain embodiments, each line may embody copper tubing that is coupled on one end to inlet 44 or the outlet 46 of the V-shaped evaporator 40 within the housing 12 of the cooling unit 10.

The other end of the tubing is coupled to a source 48 of liquid refrigerant, such as a refrigerant distribution unit, which may be configured to deliver liquid refrigerant to the cooling unit and receive vaporized refrigerant from the cooling unit. In one embodiment, liquid refrigerant entering the cooling unit 10 may flow through an electronic expansion valve (not shown), which is provided to control the delivery of liquid refrigerant into the cooling unit.

In one embodiment, the controller 29 may be configured to calculate the capacity of the operation of the cooling unit 10 based on information obtained by the controller. Cooling capacity may be determined by measuring airflow, supply air temperature and return air temperature. In the shown embodiment, liquid refrigerant flows to the bottoms of the slabs 40 of the V-shaped evaporator 30. For the shown V-shaped evaporator 30, there are six separate inlets 44, three inlets for each side 32, 34 of the V-shaped evaporator 30. Liquid refrigerant traveling through each slab 40 is evaporated heated by the hot air drawn through the V-shaped evaporator 30 by the fans 28. Specifically, liquid refrigerant is evaporated as the refrigerant travels upwardly through each slab 40 and then downwardly through the slab as illustrated by arrows D and E in FIG. 7.

Referring again to FIGS. 5-7, in one embodiment, the coil 42 may embody micro channel coils, which is a ladder-type structure having a pair of larger pipes spaced apart from one another with smaller micro channel coils extending between the larger pipes. In one example, the arrangement is such that liquid refrigerant enters the V-shaped evaporator 30 by the supply line connected at one end to the inlet 44 and at its other end to the source of liquid refrigerant (e.g., refrigeration distribution unit). Once within the V-shaped evaporator 30 of the cooling unit 10, the liquid refrigerant enters and flows through the micro channel coils 42. The exteriors of the micro channel coils 42 have fins that absorb heat from warm air flowing toward the cooling unit 10 thereby evaporating the liquid refrigerant flowing through the micro channel coils. The vaporized refrigerant is exhausted into the return line connected at one end to the outlet 46 and at its other end to the source of liquid refrigerant.

Figure 7:
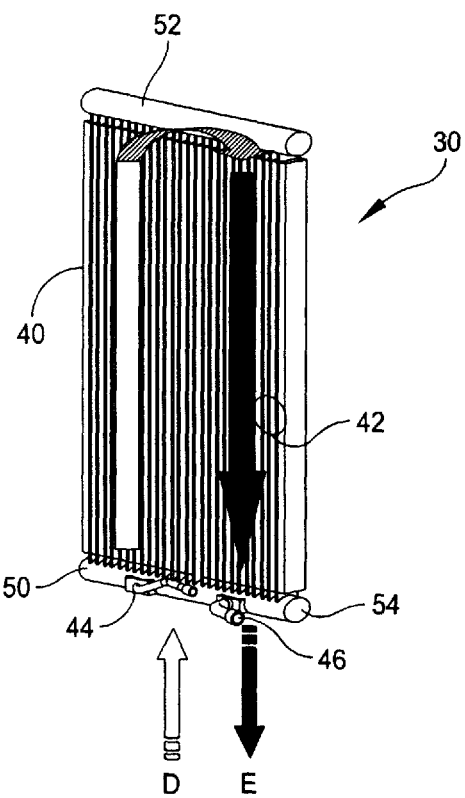
FIG. 7 is a schematic view showing refrigerant flowing through a slab of the V-shaped evaporator.

In FIG. 7, an exemplary slab 40 of the V-shaped evaporator 30 includes an inlet header 50, which has the inlet 44, provided on one side of the slab (e.g., the left-hand side of the slab illustrated in FIG. 7). The inlet header 50 functions as a manifold to mix and universally distribute the refrigerant into the micro channel coils 42 provided on the side of the slab 40. The refrigerant travels through the micro channel coils 42 of the side of the slab until it reaches a transfer header 52, which extends across the entire width of the slab 40. Refrigerant then travels from the transfer header 52 back through micro channel coils 42 provided on the other side of the slab (e.g., the right-hand side of the slab illustrated in FIG. 7). As the refrigerant travels through the second side of the slab 40, the refrigerant becomes a superheated gas by the time it reaches an outlet header 54 provided at the bottom of the other side of the slab. The outlet header 54 includes the outlet 46, which is connected to the return line to return the superheated gas to the refrigerant source.

Figure 8:
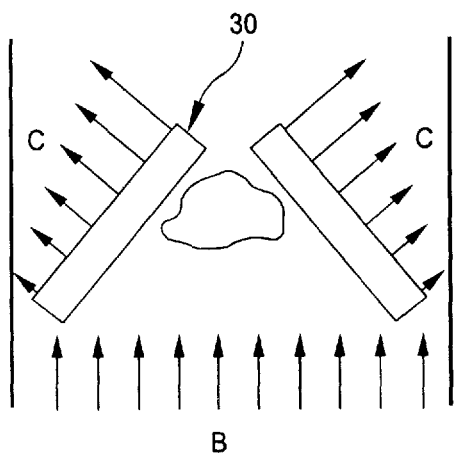
FIG. 8 is a schematic view showing airflow through the V-shaped evaporator.

The arrangement is such that refrigerant entering the left-hand side of the slab 40 of the V-shaped evaporator 30 is gradually heated as the refrigerant travels up through the slab to the transfer header 52. The evaporated two-phase refrigerant travels into the right-hand side of the slab 40 and is gradually super heated as the refrigerant travels to the outlet header 54. Thus, the resultant temperature of air travelling through the slab 40 of the V-shaped evaporator 30 by each fan 28 is substantially uniform across the width of the cooling unit 10. This airflow of air through the V-shaped evaporator 30 is illustrated in FIG. 8. Air (indicated by arrows B) is drawn into the cooling unit 10 by the fans 28 and as shown in FIG. 8 is fairly uniform prior to entering the V-shaped evaporator (indicated by arrows C). Once air travels through the panels of the V-shaped evaporator 30, the air is directed in a direction generally perpendicular to the face of the panel of the V-shaped evaporator. The cool air is then blown through the front 14 of the cooling unit 10 by the fans 28.

Although the housing 12 of the cooling unit 10 is illustrated in the drawings as being one-half the width of an equipment rack, the cooling unit may be sized to any desired configuration. The provision of a cooling unit 10 having one-half the industry-standard width improves the scalability of the cooling unit. However, it is contemplated, for example, to configure the housing 12 to have the same width as the housing of the equipment rack. In such an embodiment, the cooling unit 10 may be configured with cooling system components that enhances the cooling capacity of the cooling unit. This configuration may be desirable for hot spots within the data center.

In certain embodiments, the controller may be employed to control the operation of the cooling system, and specifically, in certain embodiments, the operation of the cooling unit 10. In one embodiment, the controller may be a dedicated unit to the cooling system. In another embodiment, the controller may be provided as part of an integrated data center control and monitoring system. In yet another embodiment, each cooling unit 10 may be independently operable by a controller provided in the cooling unit that is in communication with controllers of the other cooling units. Notwithstanding the particular configuration, the controller is designed to control the independent operation of the cooling unit within the data center.

For example, the controller may be configured to identify the failure or inability of the particular cooling unit to cool the air, and to increase the cooling capacity of the cooling unit or cooling units located near the failed cooling unit. In another embodiment, one cooling unit may operate as the main or master unit and the other cooling units operate as subservient units that operate under the control of the main unit. In this embodiment, the main cooling unit may be manipulated by the data center operator to control the entire cooling system. For example, the controller may be configured to receive information from the equipment racks so as to determine the amount of power being drawn by each equipment rack. With this knowledge, the controller may be configured to increase the cooling capacity of certain cooling units within the cooling system based on the energy drawn by the equipment racks.

In one embodiment, the controller may embody only controller unit provided in the cooling units that communicate with one another over a controller area network (CAN) Bus. In other embodiments, a master controller may be provided to control the operation of the controller units. Changes to the environmental conditions, such as the temperature of the data center, results in changes of inputs including the temperature of the refrigerant flowing into and out of the cooling unit.

Referring back to FIG. 1, in operation, filtered warm air is drawn into the cooling unit 10. At this point, the air temperature is measured. Next, the warm air flows across the V-shaped evaporator 30, which absorbs heat from the air, thereby cooling off the air. At this point, the temperature is sampled again. The fans 28 blow the cooled air through the front 14 of the cooling unit 10. The fans 28 may be individually controlled to manipulate the air flow through the cooling unit 10.

The cooling unit 10 shown and described herein may be utilized to achieve a method of cooling warm air within a data center housing electronic equipment. In a certain embodiment, the method includes positioning a cooling unit 10 in a data center, drawing relatively warm air into the cooling unit, and moving the warm air over a V-shaped evaporator 30 positioned within the housing 12 of the cooling unit and coupled to a source of liquid refrigerant.

Thus, it should be observed that the construction of the V-shaped evaporator enables the components of the cooling unit to be located within a narrow rack space, such as a one-half width cooling rack. The construction of the V-shaped evaporator has a comparatively larger surface area so that it can more effectively treat air traveling through the cooling unit. With each side of the V-shaped evaporator having three separate slabs, there is very little pressure drop in refrigerant flowing through each slab.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A cooling unit comprising
a housing having a front and a back;
at least one fan provided at one of the front and the back of the housing; and
a V-shaped evaporator positioned within the housing and coupled to a source of liquid refrigerant, the evaporator having two panels extending from adjacent the bottom of the housing to adjacent the top of the housing when positioning the evaporator in the housing, the arrangement being such that an inside of the panels of the evaporator face air being drawn through the housing of the cooling unit by the at least one fan, each panel of the V-shaped evaporator including at least two cooling slabs in fluid communication with the source of liquid refrigerant and arranged one on top of the other so that the at least two cooling slabs extend vertically in the housing, each cooling slab of the at least two cooling slabs including
an inlet for receiving liquid refrigerant from the source of liquid refrigerant and an outlet to exhaust vaporized refrigerant to the source of liquid refrigerant,
an inlet header having the inlet, and an outlet header having the outlet, the inlet header and the outlet header being provided at one end of the cooling slab, and
a transfer header disposed between the inlet header and the outlet header, the transfer header being provided at an opposite end of the cooling slab and extending across an entire width of the cooling slab,
wherein a transfer header of a first cooling slab is positioned adjacent an inlet header and an outlet header of a second, adjacently placed cooling slab, with the first cooling slab being separated from the second cooling slab.

2. The cooling unit of claim 1, wherein the at least one cooling slab further includes micro channel coils disposed between the inlet header and the outlet header.

3. The cooling unit of claim 1, wherein the at least one cooling slab further includes micro channel coils disposed between the inlet header and the transfer header and micro channel coils disposed between the transfer header and the outlet header.

4. The cooling unit of claim 1, wherein the housing of the cooling unit is one-half the width of a standard size nineteen inch equipment rack.

5. The cooling unit of claim 1, wherein the inlet header and the outlet header share a common body.

6. A method of cooling warm air, the method comprising:
positioning a cooling unit in a data center;
drawing relatively warm air into the cooling unit; and
moving the warm air over a V-shaped evaporator positioned within a housing of the cooling unit and coupled to a source of liquid refrigerant,
wherein the evaporator includes two panels extending from adjacent the bottom of the housing to adjacent the top of the housing, the arrangement being such that an inside of the panels of the evaporator face air being drawn through the housing of the cooling unit by the at least one fan,
wherein each panel of the V-shaped evaporator includes at least two cooling slabs in fluid communication with the source of liquid refrigerant, and
wherein each panel of the V-shaped evaporator includes at least two cooling slabs in fluid communication with the source of liquid refrigerant and arranged one on top of the other so that the at least two cooling slabs extend vertically in the housing, each of the at least two cooling slabs including
an inlet for receiving liquid refrigerant from the source of liquid refrigerant and an outlet to exhaust vaporized refrigerant to the source of liquid refrigerant,
an inlet header having the inlet and an outlet header having the outlet, the inlet header and the outlet header being provided at one end of the cooling slab, and
a transfer header disposed between the inlet header and the outlet header, the transfer header being provided at an opposite end of the cooling slab and extending across an entire width of the cooling slab,
wherein a transfer header of a first cooling slab is positioned adjacent an inlet header and an outlet header of a second, adjacently placed cooling slab, with the first cooling slab being separated from the second cooling slab.

7. The method of claim 6, wherein each cooling slab further includes micro channel coils disposed between the inlet header and the outlet header.

8. The method of claim 6, wherein the inlet header and the outlet header share a common body.

* * * * *